(12) United States Patent
Goto et al.

(10) Patent No.: US 7,247,819 B2
(45) Date of Patent: Jul. 24, 2007

(54) SUBSTRATE HEATING APPARATUS (75) Inventors: Yoshinobu Goto, Nagoya (JP); Hideyoshi Tsuruta, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/159,820

(22) Filed: Jun. 23, 2005

(65) Prior Publication Data

US 2006/0011611 A1 Jan. 19, 2006

(30) Foreign Application Priority Data

Jun. 28, 2004 (JP) .......................... P2004-189961

(51) Int. Cl.
H05B 3/68 (2006.01)
H05B 3/08 (2006.01)

(52) U.S. Cl. .................... 219/444.1; 219/541

(58) Field of Classification Search .. 219/443.1–408.2, 219/541–548; 118/724, 725

See application file for complete search history.

(56) References Cited

U.S. PATENT DOCUMENTS 5,059,770 A * 10/1991 Mahawili .................... 219/391
5,702,624 A * 12/1997 Liao et al. ................ 219/444.1
6,753,508 B2   6/2004 Shirakawa
6,809,299 B2 * 10/2004 Hiramatsu et al. ....... 219/444.1
6,921,881 B2   7/2005 Ito et al.
7,044,399 B2   5/2006 Goto et al.
2003/0075537 A1* 4/2003 Okajima et al. ......... 219/444.1

FOREIGN PATENT DOCUMENTS

| GB | 2 330 003 | 4/1999 |
|---|---|---|
| JP | 2001-52843 | 2/2001 |
| JP | 2001-052843 A1 | 2/2001 |
| JP | 2002-353110 | 12/2002 |
| JP | 2004-171894 | 6/2004 |
| KR | 2004-0031691 | 4/2004 |
| WO | 00/62333 | 10/2000 |

* cited by examiner

*Primary Examiner*—Sang Paik
(74) *Attorney, Agent, or Firm*—Burr & Brown (57) ABSTRACT A substrate heating apparatus is provided, including a base group including a plurality of bases, which are arranged substantially into a plate with a gap interposed between the bases, and which form a substrate mounting surface. A resistance heating element provided for at least one of the bases.

19 Claims, 7 Drawing Sheets

SUBSTRATE HEATING APPARATUS

CROSS REFERNCE TO RELATED APPLICATIONS

This application is based upon and claims the benefit of priority from prior Japanese Patent Application No. P2004-189961, filed on Jun. 28, 2004, the entire contents of which are incorporated herein by reference.

BACKGROUND OF THE INVENTION

1. Field of the Invention

The present invention relates to a substrate heating apparatus heating a substrate.

2. Description of the Related Art

In semiconductor manufacturing processes and the like, a ceramic heater including a disk-shaped ceramic base, in which a linear resistance heating element is buried, is widely used as a substrate heating apparatus.

As the method of heating a substrate, recent semiconductor manufacturing processes actively use non-contact type lamp heating using a halogen lamp or the like as well as the contact type heating using the ceramic heater. In the cases of using the lamp heater, the ceramic heater is often used together for supplementarily heating the substrate.

In the semiconductor manufacturing processes, to increase a production yield, it is required to equalize substrate surface temperature with high accuracy. The ceramic heater is therefore required to perform fine temperature adjustment according to an environment around the substrate. For example, a multi-zone heater, in which the inside of the ceramic base is divided into a plurality of zones and a suitable heating value is set for each zone has been examined (Japanese Patent Laid-Open publication No. 2001-52843). With the multi-zone heaters, a heating value is optimally adjusted according to locations in a substrate mounting surface. The Japanese Patent Laid-Open publication No. 2001-52843 has proposed a multi-zone heater in which the ceramic base is divided into nine zones each including a resistance heating element buried therein. In any one of the conventional multi-zone heaters, the plurality of resistance heating elements are buried in the single-piece base.

However, in the multi-zone heaters in which the heating value varies by location, hot and cold sections are locally formed in the conventional single-piece base. Accordingly, local stress is more likely to generate in the base with the resistance heating elements buried therein. The ceramic base, in particular, has a tendency to be more sensitive to tensile stress than to compressive stress. The peripheral parts of the hot and cold sections in which tensile stress generates are more likely to damage.

Not only the ceramic heater but also a substrate heating apparatus using metal or resin for the base on which a substrate is placed involves the problem of stress generation due to the difference in temperature settings by location.

SUMMARY OF THE INVENTION

An object of the present invention is to provide a substrate heating apparatus, which is prevented from damage due to difference in temperature settings by location.

A substrate heating apparatus according to an embodiment of the present invention includes a base group including a plurality of bases, which are arranged into substantially a plate with a gap interposed between the bases and form a substrate mounting surface, and a resistance heating element provided for at least one of the bases.

According to such a substrate heating apparatus, a conventional single-piece base is divided into a plurality of bases, and the bases are arranged with a gap interposed between each of the bases. The presence of the gap therefore suppresses temperature gradient generated in each base even when each of the bases is set to a different temperature. Accordingly, stress generated due to differences in temperature settings of the bases is reduced. Furthermore, the gap can provide a space to absorb stress. Therefore, the bases can be prevented from damage.

DETAILED DESCRIPTION OF THE INVENTION

Each of substrate heating apparatuses according to embodiments of the present invention is a substrate heating apparatus in which a plurality of bases divided into a plurality of areas are arranged with a gap interposed between each of the bases such that the whole plurality of bases form substantially a plate. A base group including the plurality of bases forms a substrate mounting surface. Furthermore, at least one of the bases includes a resistance heating element.

A conventional single-piece base is divided into several bases, and the plurality of separate bases are arranged with a gap interposed between each of the bases. Accordingly, the individual bases can be independent from each other. It is therefore possible to suppress stress generation due to difference in temperature settings by location. The division pattern of the bases and the number of the bases are not limited and can be selected according to an environment around the substrate heating apparatus, a desired distribution of substrate temperature or the like. The bases can be made of any one of metal, resin, and ceramic. Hereinafter, a specific description is given of a substrate heating apparatus according to each embodiment with reference to the drawings.

FIRST EMBODIMENT

Figure 1A:
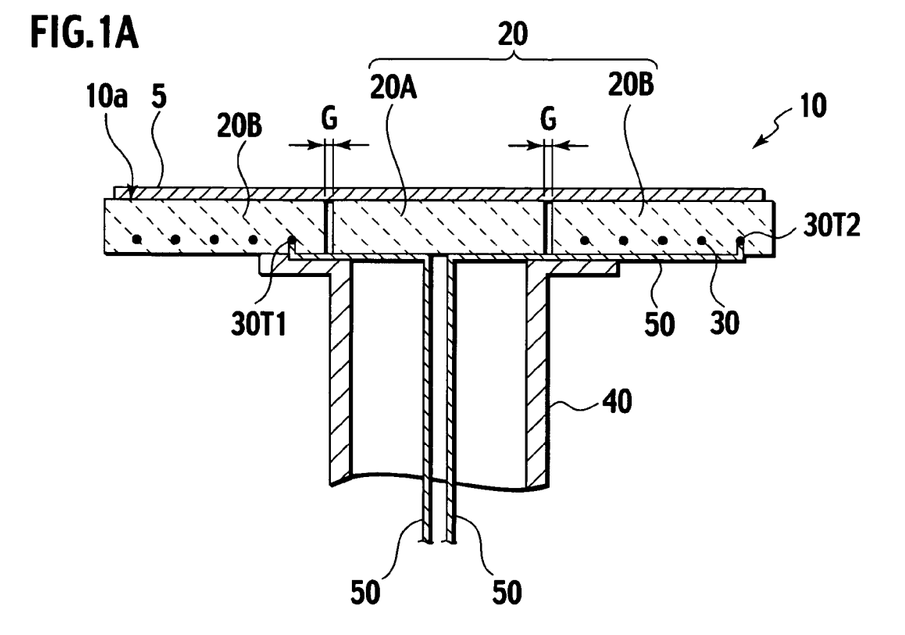
FIG. 1A is a cross-sectional view of a ceramic heater according to a first embodiment of the present invention.
Figure 1B:
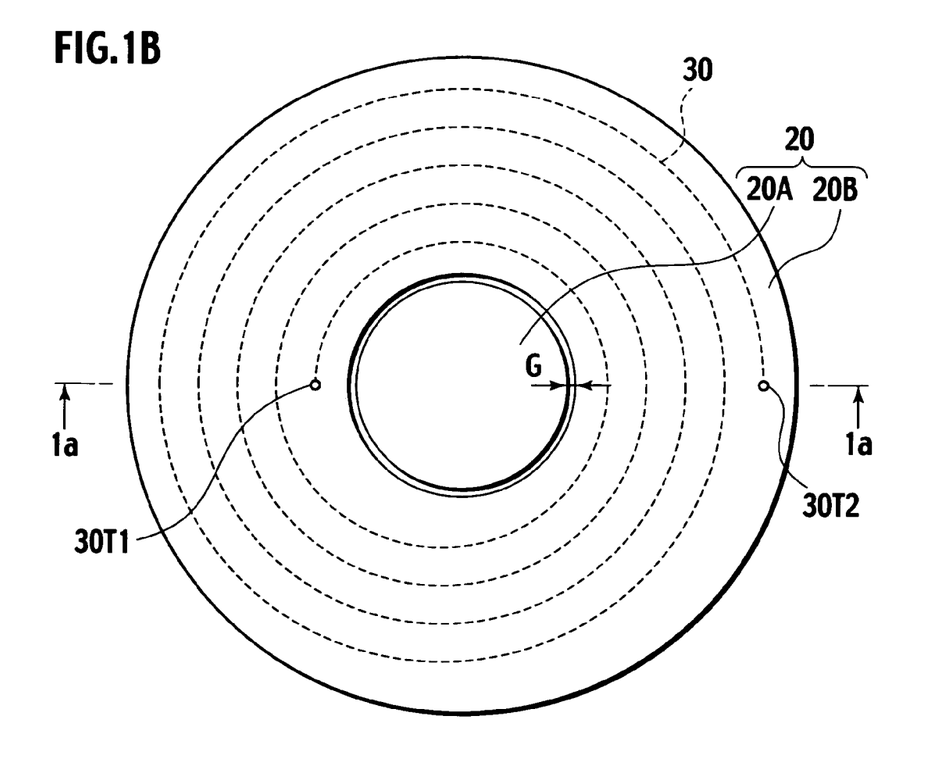
FIG. 1B is a plan view of a ceramic base group thereof.

A substrate heating apparatus according to a fist embodiment is a ceramic heater using ceramic for the base. In other words, the base includes a ceramic. FIG. 1A is a cross-sectional view of a ceramic heater 10, and FIG. 1B is a plan view of a ceramic base group 20.

The ceramic heater 10 includes a ceramic base group 20. The ceramic base group 20 includes two separate parts of a ceramic base 20A in the central part and a ceramic base 20B in the peripheral part thereof, which are obtained by dividing a conventional single-piece disk-shaped base and are arranged on a same plane with a gap G interposed therebetween. In other words, the ceramic base group 20 includes the ceramic base 20A as a first base and the annular ceramic base 20B as a second base arranged in the periphery of the first base. The ceramic heater 10 uses the disk-shaped ceramic base 20A and a ring-shaped ceramic base 20B surrounding the same.

The ceramic bases 20A and 20B are arranged into substantially a plate with the gap interposed therebetween to form a substrate mounting surface 10a. In FIGS. 1A and 1B, the ceramic bases 20A and 20B form the disk-shaped ceramic base group 20. A substrate 5 as a heated object is therefore placed on the substrate mounting surface 10a, which is one surface of the ceramic base group 20. The substrate 5 is, for example, a semiconductor wafer, a liquid crystal substrate, or the like.

A resistance heating element 30 may be provided for at least one of the bases. In FIG. 1A, the resistance heating element 30 is buried in the ceramic base 20B in the peripheral part while no resistance heating element is provided for the ceramic base 20A in the central part. The shape of the resistance heating element 30 is not particulary limited, and for example, a linear metal bulk can be spirally arranged as shown in FIG. 1B.

Furthermore, the ceramic heater 10 can include a tubular member 40 directly or indirectly connected to the central part of a surface of the ceramic base group 20 opposite to the substrate mounting surface 10a. For example, as shown in FIG. 1A, the cylindrical tubular member 40 can be directly connected to the surface (backside) of the ceramic base group 20 opposite to the substrate mounting surface 10a. The ceramic base group 20 is supported by the tubular member 40 from the backside.

The tubular member 40 supports the ceramic base group 20. An end of the tubular member 40 can be fixed to a wall of the apparatus. The tubular member 40 functions as a protection tube for power feeders 50 connected to terminals 30T1 and 30T2 of the resistance heating element 30. The tubular member 40 may be connected to the ceramic bases 20A and 20B by either screwing or brazing.

The ceramic base group 20, depending on use applications or use conditions, may be directly or indirectly placed on a simple support or the apparatus instead of the tubular member 40. In this case, the support or the apparatus supports the ceramic base group 20.

Furthermore, the terminals 30T1 and 30T2 of the resistance heating element 30 are connected to the power feeders 50. The terminals 30T1 and 30T2 are input power from the power feeders 50 and output power to the resistance heating element 30. The power feeders 50 can be wired along the surfaces (outer surfaces of the ceramic bases) of the ceramic bases 20A and 20B opposite to the substrate mounting surface 10a instead of being buried in the ceramic bases 20A and 20B. The power feeders 50 can be therefore made of a material with lower resistance, which can prevent heat generation from the power feeders 50 themselves.

The power feeders 50 may be individually buried and wired in the ceramic bases 20A and 20B. The power feeders 50 are not exposed to the outside of the ceramic bases, which prevents corrosion thereof. In this case, preferably, the power feeders 50 are made of a material capable of withstanding sintering temperature of the ceramic bases 20A and 20B. For example, the power feeders 50 can be made of a heat-resistant conductive material similar to the resistance heating element 30. Such a material has a comparatively large resistance, and the power feeders 50 could sometimes generate heat.

In the ceramic heater 10, the resistance heating element 30 is buried only in the ceramic base 20B in the peripheral part. It is therefore possible to set only the ceramic base 20B in the peripheral part to high temperature while keeping the ceramic base 20A at low temperature.

In the case of using the single-piece ceramic base and heating the peripheral part with a resistance heating element like a conventional heating apparatus, strong tensile stress due to thermal gradient is generated in the boundary between the central part and the peripheral part when a difference between temperature settings of the central part and the peripheral part is larger than a certain value. This could result in damage to the ceramic base. However, the ceramic heater 10 is provided with the gap G between the ceramic base 20A in the central part and the ceramic base 20B in the peripheral part and provides a space to release stress generated by thermal expansion of the ceramic bases 20A and 20B. Furthermore, because of a thermal insulation effect of the gap G, each base is less likely to influence by the temperature setting of the other adjacent ceramic base. Accordingly, it is possible to prevent generation of large thermal gradient in each base and more accurately and independently set temperatures of the separate bases. Damage to the ceramic bases due to differences in temperature settings by location can be therefore prevented.

The width of the gap G is, depending on size of the ceramic heater 10 or the temperature settings of the ceramic bases 20A and 20B, preferably about 0.1 mm to about 10 mm. Setting the gap G equal to or greater than about 0.1 mm can prevent the adjacent ceramic bases 20A and 20B from contacting with each other by thermal expansion during heating, thus further preventing damage. Setting the gap G equal to or less than about 10 mm can prevent the gap G from being a cold zone and equalize the temperature of the substrate 5. The gap G is more preferably about 0.2 mm to about 5 mm, and still more preferably about 0.4 mm to about 3 mm.

The usage like the ceramic heater 10 in which the ceramic base 20A in the central part is maintained at low temperature and only the ceramic base 20B in the peripheral part is set to high temperature is suitably applied to, for example, a case of heating the substrate 5 together with a lamp heater using a halogen lamp or the like. Specifically, the central part of the substrate 5 is heated by radiation from the lamp heater disposed above the substrate 5. On the other hand, the peripheral part of the substrate 5 releases a large amount of heat to be easily cooled, and the temperature thereof is not raised to the same level as the central part of the substrate 5 only with the lamp heater. Accordingly, heating only the peripheral part of the substrate 5 with the ceramic heater 10 can equalize the temperature of the entire substrate 5.

Next, a more specific description is given of each constituent material of the ceramic heater 10. The material of the ceramic base group 20 is not particularly limited and can be aluminum nitride (AlN), alumina ($Al_2O_3$), silicon nitride ($SiN_x$), silicon carbide (SiC), mullite ($Al_6Si_2O_{13}$), boron nitride (BN), sialon ($Si_{6-z}Al_zO_zN_{8-z}$), or the like. Preferably, the ceramic bases 20A and 20B include aluminum nitride. This allows the ceramic bases 20A and 20B to have high thermal conductivity, thus further increasing the temperature uniformity of the substrate mounting surface 10a.

The substrate mounting surface 10a is not limited to a flat surface. It is possible to emboss the substrate mounting surface 10a, or in the substrate mounting surface 10a, form a recess according to the size of the substrate 5 or form a channel for purge gas. Furthermore, through holes to insert lift pins may be formed in the ceramic bases 20A and 20B when needed.

The size and shape of the entire ceramic base group 20 and the sizes and shapes of the ceramic base 20A in the central part and the ceramic base 20B in the peripheral part are not limited and can be optimally selected according to the size and shape of the substrate 5 placed on the substrate mounting surface 10a, heating conditions including size and shape of a lamp heater combined as a heating source, apparatus conditions around the ceramic heater 10, and the like.

For example, the shape of the entire ceramic base group 20 can be, in addition to a disk shape, a polygonal plate shape such as a rectangular plate according to the size and shape of the substrate 5. The planar shape of the ceramic base 20A can be a circle or a polygon such as a rectangle. For example, the planar shape of the ceramic base 20A may be a circle with a diameter of about 50 mm to about 150 mm, a polygon with a width of about 50 mm to about 150 mm, or the like. The planar shape of the ceramic base 20B in the peripheral part may be, for example, an annulus such as a circular ring or angular ring. For example, in the case of using the ceramic heater 10 as the substrate heating apparatus for the substrate 5 with a diameter of about 200 mm to about 300 mm, the outer diameter of the ceramic base 20B is set to about 200 mm to about 400 mm.

Preferably, the resistance heating element 30 includes at least one of molybdenum and tungsten. For example, the resistance heating element 30 may be made of a high-melting point conductive material such as molybdenum (Mo), tungsten (W), molybdenum carbide (MoC), and tungsten carbide (WC). The material of the resistance heating element 30 is not limited to the high-melting point conductive material and may be Ni, TiN, TiC, TaC, NbC, HfC, $HfB_2$, $ZrB_2$, carbon, or the like. Moreover, as the resistance heating element 30, various types of resistance heating elements can be used a ribbon-shaped, a mesh-shaped, a coil spring shaped, a sheet-shaped, and a printed resistance heating element. In FIG. 1A, the resistance heating element 30 is buried in the ceramic base 20B, but the way of providing the heating element 30 is not limited. For example, the resistance heating element 30 may be provided on the backside (the opposite surface to the substrate mounting surface 10a) of the ceramic base 20B.

Preferably, the tubular member 40 includes at least one of a metal and a ceramic. More preferably, the tubular member 40 is formed of a ceramic of the same material as that of the ceramic bases 20A and 20B.

Preferably, each power feeder 50 includes at least one of nickel and aluminum. For example, the power feeders 50 can be formed of a low resistance metal wire such as a nickel or aluminum wire with a diameter of about 1 mm.

Next, a description is given a manufacturing method for the ceramic heater 10. First, the disk-shaped ceramic base 20A (the planar shape is a circle) and the ring-shaped ceramic base 20B with the resistance heating element 30 buried therein are formed.

As for the ceramic base 20A, which does not include the resistance heating element 30, ceramic raw powder and a sintering additive are mixed, stirred, and granulated by a spray dryer to prepare granulated powder. The granulated powder is filled into a metal mold and pressed to form a compact. The compact is then sintered by, for example, hot pressing, atmospheric sintering, or the like.

As for the ring-shaped ceramic base 20B, which includes the resistance heating element 30 buried therein, ceramic raw powder and a sintering additive are mixed, stirred, and granulated by a spray dryer to prepare granulated powder. The granulated powder is filled into a metal mold and pressed to form a preform. The resistance heating element 30 processed into a wound body is placed on the preform, and the ceramic powder is filled thereon and pressed to form a compact with the buried resistance heating element 30. The compact is then sintered by, for example, hot pressing, atmospheric sintering, or the like.

When aluminum nitride is used for the ceramic raw powder and sintered by hot pressing in the process of forming the ceramic bases 20A and 20B, preferably, the ceramic bases 20A and 20B are sintered in nitrogen at a temperature of about 1700° C. to about 2000° C. for about 1 hour to about 10 hours. Pressure of the hot pressing is preferably about 20 to about 1000 $kgf/cm^2$, and more preferably about 100 to about 400 $kgf/cm^2$. In the hot pressing, pressure is applied in the axial direction at sintering. When the resistance heating element 30 is buried, it is therefore possible to achieve good adhesion between the resistance heating element 30 and the ceramic base 20B therearound. When a bulk of metal or the like is used for the resistance heating element 30, the resistance heating element 30 is not deformed by pressure applied during the hot press sintering. The obtained sintered product is subjected to surface polishing when necessary, and holes to connect the terminals 30T1 and 30T2 and through holes to insert lift pins are then formed.

Furthermore, the outer diameter of the disk-shaped ceramic base 20A or the inner diameter of the ring-shaped ceramic base 20B is adjusted such that the gap G between the ceramic base 20A and the ceramic base 20B is about 0.1 mm to about 10 mm and, more preferably, about 0.2 mm to about 5 mm.

In the aforementioned manufacturing method, each of the ceramic bases 20A and 20B is formed through the independent forming compacts process and sintering the compacts process. However, the ceramic bases 20A and 20B may be formed by forming a compact or sintered body of a single-piece ceramic base and then dividing the same into the central part and the peripheral part by grinding.

Subsequently, the tubular member 40 separately formed is attached to the ceramic base group 20 (the ceramic bases 20A and 20B). When the tubular member 40 is formed of ceramic, for example, when the tubular member 40 is formed using a material of the same as the ceramic bases 20A and 20B, forming a compact and sintering the compact are performed in the substantially same manner as the ceramic bases 20A and 20B, and then processing the sintered body is performed. For forming the compact, various methods can be used, and it is preferable to use CIP (cold isostatic pressing), slip casting, or the like suitable for forming a comparatively complex shape. Also for sintering, various methods can be used, and it is desirable to use atmospheric sintering because the compact has a complex shape. When aluminum nitride powder is used as the ceramic raw powder, the sintering can be performed in nitrogen at about 1700° C. to about 2000° C. for about 1 hour to about 10 hours. Subsequently, the side surface of the sintered body and a surface thereof to which the ceramic base group 20 is joined are subjected to lapping or the like. The obtained tubular member 40 is joined to the ceramic bases 20A and 20B by, for example, screwing or brazing.

When the tubular member 40 is formed of metal, the tubular member 40 is formed by grinding a metallic tube. In this case, it is preferable that the power feeders 50 are accommodated in an insulating tube of alumina to ensure insulation.

In the aforementioned ceramic heater 10, the ceramic base group 20, which has been composed of a single piece, includes the separate disk-shaped (the planar shape is a circle) ceramic base 20A and ring-shaped ceramic base 20B with the resistance heating element 30 buried therein. Furthermore, the predetermined gap is provided therebetween. Accordingly, the central part and the peripheral part of the ceramic base group 20 can be set to different temperatures. Moreover, even when the temperature settings are different, the presence of the gap can prevent steep temperature gradient from being formed within each ceramic base. It is therefore possible to prevent damage due to generation of thermal stress. Especially when the difference between the temperature settings of the ceramic bases 20A and 20B is equal to or more than about 20° C. at certain in-plane positions within the substrate mounting surface 10a, the separate ceramic bases have a large effect on suppressing the thermal stress generated within the ceramic bases. Even when the difference in temperature between the adjacent ceramic bases is equal to or more than 50° C., the damage to the ceramic bases can be prevented.

Such a ceramic heater 10 is suitably utilized as, for example, the substrate heating apparatus heating a substrate such as a semiconductor wafer or a liquid crystal substrate used in the semiconductor manufacturing process or a liquid crystal manufacturing process. The bases are formed of ceramic having a high corrosion resistance, and the resistance heating element 30 is buried in the ceramic base 20B and not exposed to the outside. Accordingly, the ceramic heater 10 is suitably used within CVD (chemical vapor deposition) equipment or dry etching equipment, which often uses corrosive gas.

SECOND EMBODIMENT

Figure 2A:
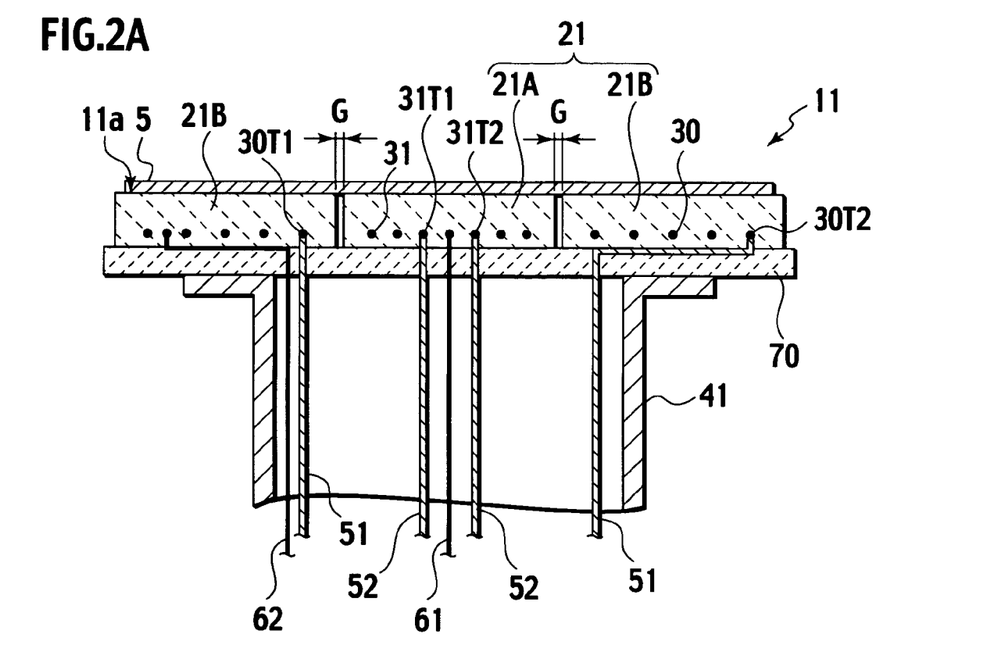
FIG. 2A is a cross-sectional view of a ceramic heater according to a second embodiment of the present invention.
Figure 2B:
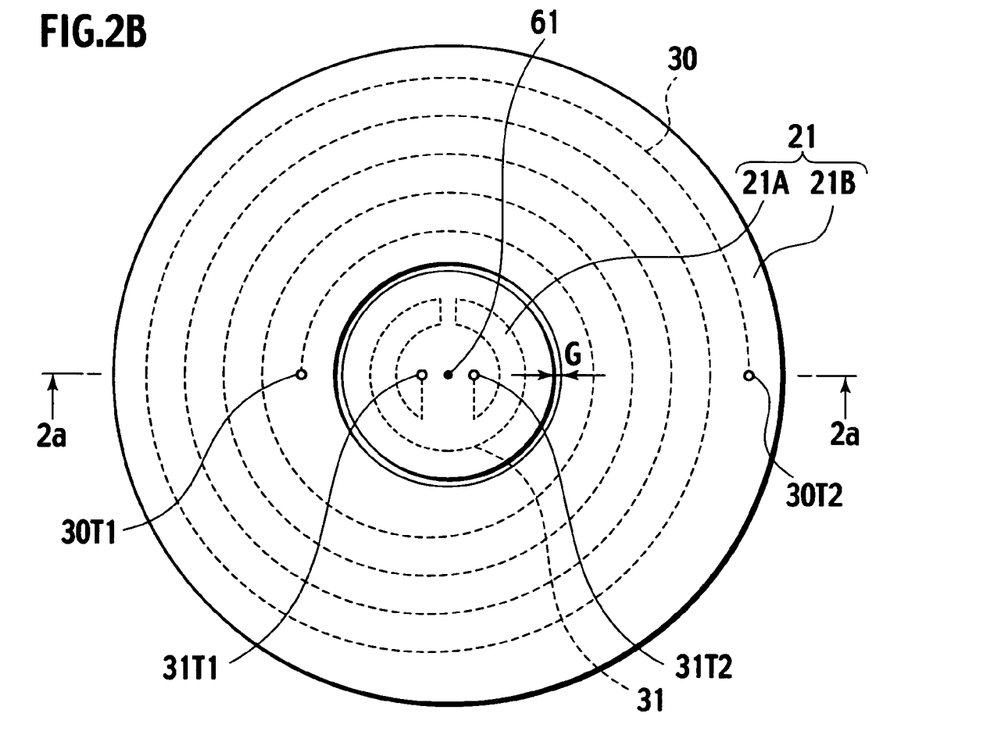
FIG. 2B is a plan view of the ceramic base group thereof.

A substrate heating apparatus according to a second embodiment is a ceramic heater 11 also using ceramic for the bases. FIG. 2A shows a cross-sectional view of the ceramic heater 11, and FIG. 2B shows a plan view of a ceramic base group 21. The ceramic heater 11 includes the ceramic base group 21. The ceramic base group 21 includes a ceramic base 21A in the central part and a ceramic base 21B in the peripheral part thereof, which are obtained by dividing the conventional single-piece disk-shaped base. The ceramic bases 21A and 21B are arranged in a same plane with the gap G interposed therebetween. The ceramic heater 11 is different from the ceramic heater 10 according to the first embodiment in that: a resistance heating element 31 is buried in the ceramic base 21A in the central part; and a plate-shaped auxiliary member 70 is provided between the ceramic base group 21 and a tubular member 41.

In the ceramic heater 11, similar to the ceramic heater 10, each ceramic base is less likely to be influenced by the temperature setting of the other adjacent ceramic base, and the temperatures can be accurately set because each ceramic base is independent. Moreover, the presence of the gap G can suppress the temperature gradient generated in each of the ceramic bases 21A and 21B and can provide a space to release stress, thus preventing damage due to the stress.

Furthermore, the separate ceramic bases 21A and 21B include the resistance heating element 31 and 30, respectively. Specifically, the ceramic base 21A includes the resistance heating element 31 having terminals 31T1 and 31T2, and the ceramic base 21B includes the resistance heating element 30 having the terminals 30T1 and 30T2. In other words, each of the ceramic bases 21A and 21B includes the resistance heating element having the independent terminals. The terminals 30T1 and 30T2 are input power from the power feeders 51 and output power to the resistance heating element 30. The terminals 31T1 and 31T2 are input power from the power feeders 52 and output power to the resistance heating element 31. This enables finer temperature control for each of the ceramic bases 21A and 21B. The ceramic base 21A in the central part can be set to a higher or lower temperature than that of the ceramic base 21B in the peripheral part.

The ceramic heater 11 includes the plate-shaped auxiliary member 70 arranged in contact with a surface of the ceramic base group 21 opposite to a substrate mounting surface 11a. The ceramic base group 21 can be placed on the plate-shaped auxiliary member 70. This can facilitate supporting the ceramic base group 21, which includes the plurality of the ceramic bases 21A and 21B, on a same plane. It is therefore possible to increase the number (the number of divisions) of the ceramic bases included in the ceramic base group 21 or make a more complex division.

The size and shape of the auxiliary member 70 are not particularly limited. For example, when the auxiliary member 70 is larger than the whole ceramic base group 21, the auxiliary member 70 can stably support the ceramic base group 21, but not indispensable. The auxiliary member 70 may have a size and a shape sufficient to support the ceramic base group 21 and cover the power feeders 51 and a thermoelectric couple 62.

As shown in FIG. 2A, preferably, the power feeder 51 connected to the terminal 30T2 of the resistance heating element 30 and the thermoelectric couple 62 are not buried in the ceramic base 21B, and are wired between the ceramic base group 21 and the auxiliary member 70. For example, the power feeder 51 and the thermoelectric couple 62 can be wired along a surface (backside) of the ceramic base group 21, specifically, ceramic base 21B opposite to the substrate mounting surface 11a. In addition, the power feeder 51 and the thermoelectric couple 62 may be wired along a surface of the auxiliary member 70 instead of the ceramic base group 21. The power feeders 51 can be therefore made of a conductor, which has lower resistance and is different from the resistance heating elements, for example, a thin wire of nickel, aluminum, or the like. Accordingly, heat generation from the power feeders 51 themselves can be suppressed. This enables more highly accurate temperature control in conjunction with the highly accurate temperature control for each of the ceramic bases 21A and 21B.

Furthermore, the auxiliary member 70 is placed on the surface of the ceramic base group 21 opposite to the substrate mounting surface 11a. Therefore, the power feeders 51 and the thermoelectric couple 62 are covered with the auxiliary member 70. It is therefore possible to prevent corrosion of the power feeders 51 and the thermoelectric couple 62 even when the ceramic heater 11 is used in corrosive gas.

Moreover, the tubular member 41 is connected to the central part of the surface of the ceramic base group 21 opposite to the substrate mounting surface 11a with the auxiliary member 70 interposed between the base group 21 and the tubular member 41. Such a tubular member 41 functions as a support for the ceramic bases 21A and 21B. The tubular member 41 can also accommodate the power feeders 51 and 52 and the thermoelectric couples 61 and 62. It is possible to prevent corrosion of the power feeders 51 and 52 and thermoelectric couples 61 and 62 by purging the tubular member 41 with inert gas or isolating the inside of the tubular member 41 from an external environment.

The material of the auxiliary member 70 is not limited. However, the auxiliary member 70 is an insulator preferably. More preferably, the auxiliary member 70 has sufficient heat resistance in an operating temperature range of the ceramic heater 11. For example, when the heater 11 is used at a comparatively low temperature equal to ore less than about 300° C., the auxiliary member 70 can be formed of an engineering plastic material such as polyimide and polyetheretherketone. When the heater 11 is used in high temperature atmosphere equal to or greater than about 400° C., it is preferable that the auxiliary member 70 includes ceramic such as alumina, aluminum nitride, silicon nitride, mullite, boron nitride, and sialon. In addition, in order to suppress generation of heat stress due to the difference between thermal expansion coefficients of the ceramic base group 21 and the auxiliary member 70 at the junction, it is preferable that the auxiliary member 70 is formed of ceramic including a main component same as that of the ceramic base group 21.

Preferably, the auxiliary member 70 includes a guide recess guiding the power feeders 51 and the thermoelectric couple 62 in the surface, which comes into contact with the ceramic base group 21. The guide recess may be provided for the ceramic base group 21.

Preferably, the auxiliary member 70 and the ceramic base group 21 are joined to each other by screwing, which can facilitate the joining process and easily enable overhaul. When the ceramic heater 11 is used in corrosive gas or used at a high temperature equal to or more than about 200° C., preferably, the auxiliary member 70 is screwed with a Ni base alloy screw such as Inconel, a carbon screw, or a ceramic screw. In order to prevent generation of thermal stress due to the difference between the thermal expansion coefficients, it is preferable that the ceramic base group 21, the auxiliary member 70, and the screw used for screwing are formed of a same ceramic, for example, aluminum nitride. In the case of using the Ni base alloy screw, it is preferable to insert heliserts of a Ni base alloy into female screw portions of the ceramic bases.

The manufacturing method for the ceramic heater 11 can basically use the same procedure as that of the manufacturing method for the ceramic heater 10. For example, the ceramic base 21A with the resistance heating element 31 buried therein is obtained by forming a compact with the resistance heating element 31 buried therein and sintering the same in the same manner as the ceramic base 20B.

When the auxiliary member 70 is formed of ceramic such as aluminum nitride, it is preferable that the auxiliary member 70 is formed and sintered under the same conditions as the manufacturing method of the ceramic base group to form a sintered body. When the auxiliary member 70 is formed of resin, it is possible to process or injection-mold a commercially available resin material into a disk.

Furthermore, the auxiliary member 70 and tubular member 41 may be a ceramic integrated sintered body. In other words, a ceramic integrated sintered body including the auxiliary member 70 and tubular member 41 may be formed with a same ceramic.

According to the above described ceramic heater 11, the ceramic base group, which has been composed of a single piece, includes the disk-shaped (the planar shape is a circle) ceramic base 21A with the resistance heating element 31 buried therein and ring-shaped ceramic base 21B with the resistance heating element 30 buried therein. Furthermore, the predetermined gap is provided therebetween. Accordingly, the central part and the peripheral part of the ceramic base group 21 can be set to different temperatures. Furthermore, the presence of the gap G can prevent steep temperature gradient from being formed within each ceramic base even when the temperature settings thereof are different from each other. Accordingly, it is possible to prevent damage due to generation of thermal stress. The damage to the ceramic bases can be prevented even when the difference in temperature between the adjacent ceramic bases is equal to or greater than 50° C.

Moreover, the ceramic heater 11 includes the plate-shaped auxiliary member 70, and the ceramic base group 21 can be placed on the auxiliary member 70. The plurality of separate ceramic bases 21A and 21B can be therefore held stably. Furthermore, the auxiliary member 70 covers the thermoelectric couple 62 and the power feeder 51 wired between the ceramic base group 21 and the auxiliary member 70. This can prevent the thermoelectric couple 62 and the power feeder 51 from being exposed. Accordingly, the ceramic heater 11 can be used in corrosive gas.

THIRD EMBODIMENT

Figure 3:
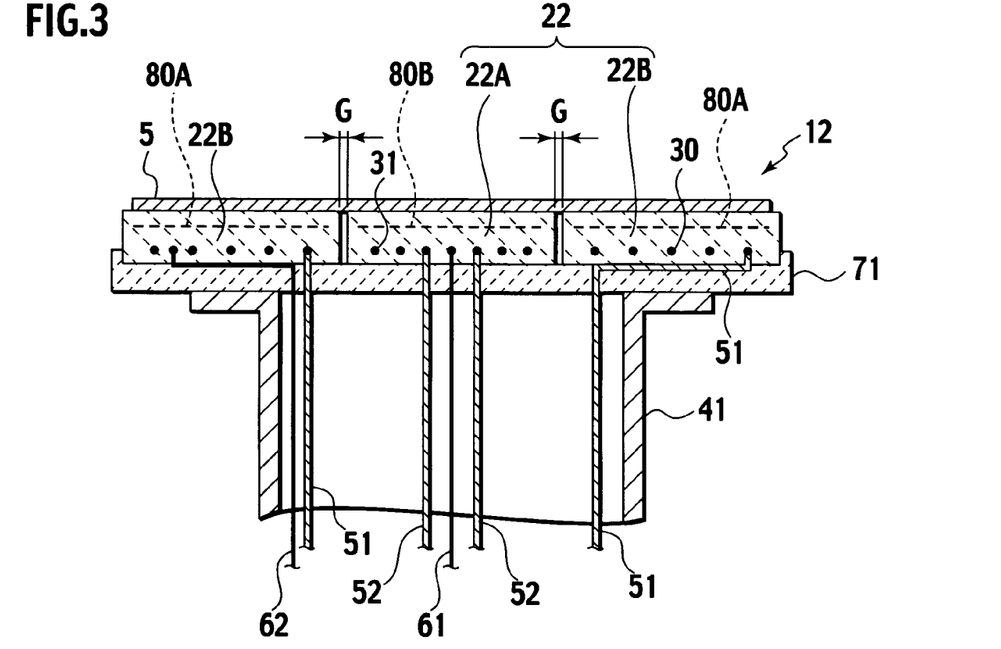
FIG. 3 is a cross-sectional view of a ceramic heater according to a third embodiment of the present invention.

FIG. 3 shows a cross-sectional view of a ceramic heater 12 according to a third embodiment of the present invention. A substrate heating apparatus according to the third embodiment is the ceramic heater 12 also using ceramic bases as the bases. Specifically, the ceramic heater 12, similar to the ceramic heater 11, includes a ceramic base 22A in the central part and a ceramic base 22B in the peripheral part, which are obtained by dividing the single-piece conventional disk-shaped base. Furthermore, the resistance heating elements 30 and 31, and electrostatic chuck electrodes 80A and 80B are buried in the ceramic bases 22A and 22B, respectively.

Specifically, the planar electrostatic chuck electrodes 80A and 80B are buried in the ceramic bases 22A and 22B of the ceramic heater 12, respectively. In the ceramic heater 12, the substrate can be closely fixed to the ceramic bases 22A and 22B by the electrostatic chuck electrodes 80A and 80B. In other words, the ceramic heater 12 includes an electrostatic chuck function, which enables the substrate placed on the substrate mounting surface to be fixed to the substrate mounting surface with good adhesion. The temperature control of the substrate 5 by the ceramic heater 12 can be performed more efficiently and more accurately.

Furthermore, it is possible to bury a radio frequency electrodes (RF electrodes) in each of the ceramic bases 22A and 22B like the electrostatic chuck electrodes 80A and 80B. This enables the ceramic heater 12 to generate plasma. In other words, the electrode for at least one of electrostatic chuck and applying radio frequency can be buried in the bases.

For the electrostatic chuck electrodes 80A and 80B or the radio frequency electrodes, it is preferable to use a high-melting point material such as molybdenum (Mo), tungsten (W), tungsten carbide (WC) and the like. The forms of the electrostatic chuck electrodes 80A and 80B and the radio frequency electrodes are not limited, and each electrode may be a plate-shaped or mesh-shaped metal bulk, a plate-shaped metal bulk with holes such as punching metal, a printed electrode using printing metal paste, or a thin film electrode formed by deposition, sputtering, or the like. The electrodes of the metal bulk can be reduced in resistance and used for the electrostatic chuck electrodes and radio frequency electrodes for generating plasma.

Furthermore, similar to the ceramic heater 11, the ceramic heater 12 includes a plate-shaped auxiliary member 71 between the ceramic base group 22 and the tubular member 41. In the surface of the auxiliary member 71, recesses are formed according to the respective ceramic bases 22A and 22B. Each of the ceramic bases 22A and 22B can be therefore fit into a predetermined position. As described above, the recesses, which the ceramic bases 22A and 22B are fit into, are formed in the auxiliary member 71. Accordingly, the positions of the ceramic bases 22A and 22B can be accurately determined, and the ceramic bases 22A and 22B can be fixed on the auxiliary member 71 without using screwing or the like.

The ceramic heater 12 can be manufactured by substantially the same method as the manufacturing method for the ceramic heater 11 according to the second embodiment. However, in the processes of producing the ceramic bases 22A and 22B, the electrostatic chuck electrodes 80A and 80B are buried in the ceramic bases 22A and 22B in the same manner as the resistance heating elements. For example, the electrostatic chuck electrodes 80A and 80B are buried in compacts, and the compacts are sintered. The auxiliary member 71 having the recesses, which the ceramic bases 22A and 22B are fit into, is formed by processing or forming a compact. The ceramic heater 12 can be formed in substantially the same manner as the second embodiment other than the above described points.

According to the ceramic heater 12, similar to the ceramic heaters 10 and 11, it is possible to prevent damage due to thermal stress to the ceramic bases 22A and 22B. The damage to the ceramic bases 22A and 22B can be prevented even when the difference in temperature between the adjacent ceramic bases 22A and 22B is equal to ore more than about 50° C. Furthermore, the ceramic base group 21 can be stably held by the auxiliary member 71. Moreover, it is possible to prevent corrosion of the thermoelectric couple 62 and the power feeder 51 wired along the ceramic base 22B. Furthermore, the substrate 5 can be stably fixed on the ceramic heater 12 by the electrostatic chuck electrodes 80A and 80B.

OTHER EMBODIMENTS

The division pattern of the ceramic bases is not limited to the division into two parts of the central part and the peripheral part. For example, division of the ceramic bases is made according to the temperature environment around the substrate 5 or around the ceramic heater. For example, a disk-shaped ceramic base may be divided along the circumferential direction or radial direction. The number of divisions is not limit. Like a ceramic heater 13 shown in FIG. 4, the disk-shaped ceramic base may be divided into five sections as a plurality of ceramic bases 23A to 23E by a combination of radial division into two parts and circumferential division into four parts. Moreover, a predetermined gap may be provided between each adjacent pair of the ceramic bases 23A to 23E. In this case, the ceramic bases 23A to 23E may respectively include resistance heating elements A to E each having independent terminals.

In the first to third embodiments, examples of the ceramic heater using ceramic for the bases are shown. The material of the bases is not limited to ceramic, and the bases may be made of metal such as aluminum or stainless, resin, or the like. When the bases are metallic, to bury the resistance heating elements in the metal bases, the resistance heating elements may be coated with an insulating material to ensure insulation between the resistance heating elements and the metal bases.

Figure 5A:
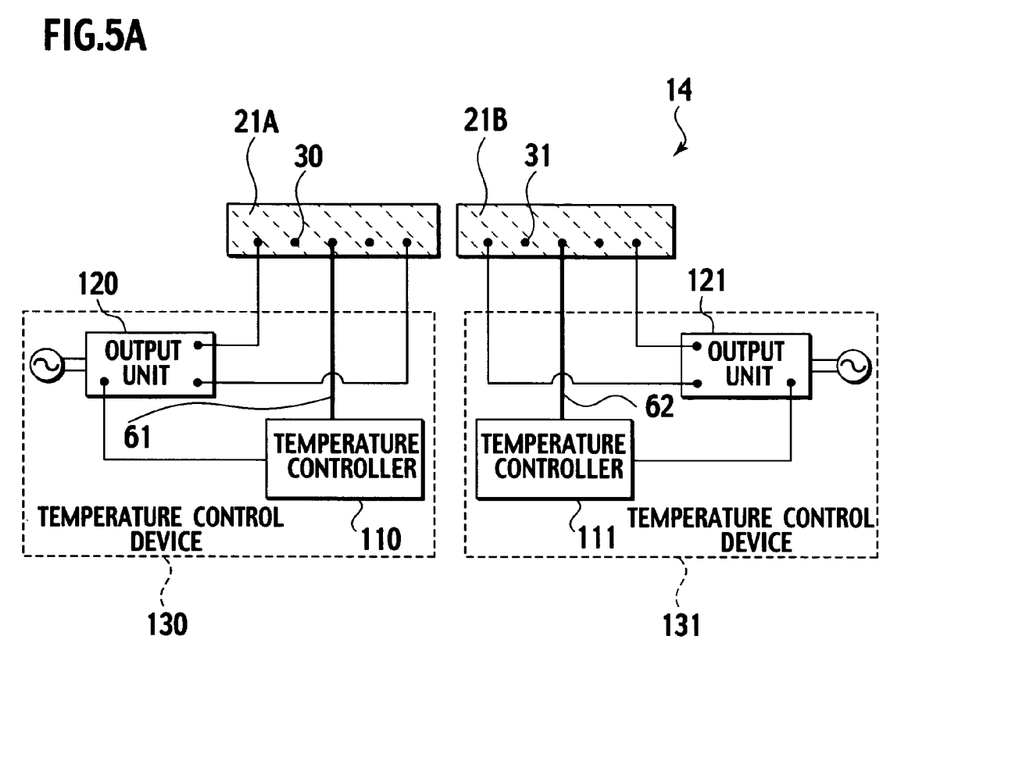
FIG. 5A is a view showing a ceramic heater according to another embodiment of the present invention.
Figure 6A:
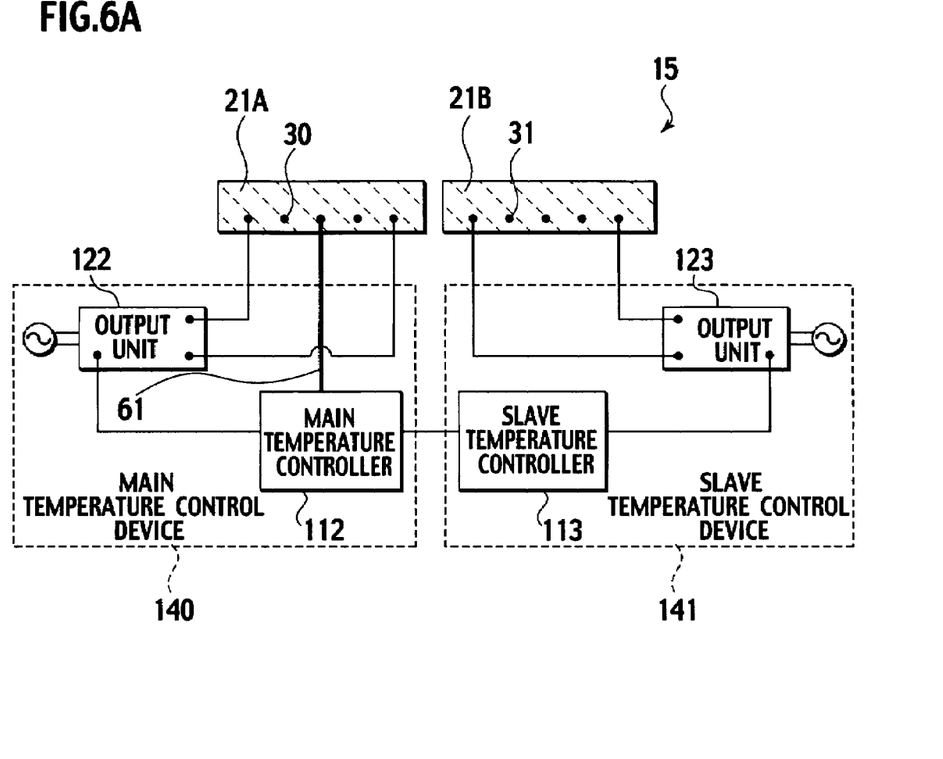
FIG. 6A is a view showing a ceramic heater according to another embodiment of the present invention.

The temperature control of each ceramic base of the ceramic heaters can be performed like, for example, ceramic heaters 14 and 15 shown in FIGS. 5A and 6A. As shown in FIG. 5A, in the ceramic heater 14, the ceramic bases 21A and 21B respectively include the resistance heating elements 30 and 31 each having independent terminals similar to the ceramic heater 11. The ceramic heater 14 further includes the thermoelectric couples 61 and 62 for the respective ceramic bases 21A and 21B. The thermoelectric couples 61 and 62 serve as temperature measurement units for each of the ceramic bases 21A and 21B. In addition, the ceramic heater 14 includes temperature control devices 130 and 131 for the respective ceramic bases 21A and 21B. The temperature control devices 130 and 131 control temperatures of the ceramic bases 21A and 21B, respectively.

The temperature control devices 130 and 131 include temperature controllers 110 and 111 and output units 120 and 121, respectively. The temperature control device 130 of the ceramic base 21A is connected to the resistance heating element 30 and thermoelectric couple 61 to control the temperature of the ceramic base 21A. The temperature control device 131 of the ceramic base 21B is connected to the resistance heating element 31 and thermoelectric couple 62 to control the temperature of the ceramic base 21B. Specifically, according to the measured temperatures and temperature settings, the temperature controllers 110 and 111 control current value outputted from the output units 120 and 121, respectively. The output units 120 and 121 supply the controlled current value to the resistance heating elements 30 and 31, respectively.

Figure 5B:
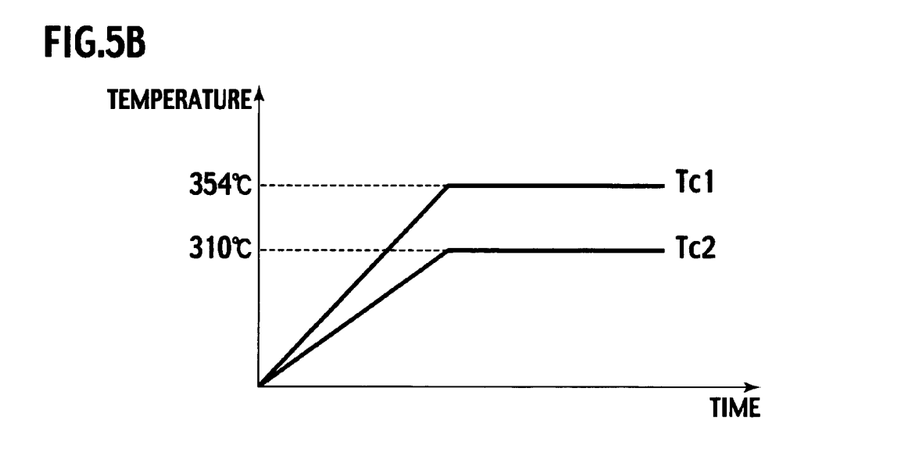
FIG. 5B is a graph showing an example of temperature control thereof.

In this case, it is possible to perform independent temperature control for each of the ceramic bases 21A and 21B. Moreover, the temperatures of the ceramic bases 21A and 21B can be monitored by the thermoelectric couples 61 and 62, respectively. For example, as shown in FIG. 5B, it is possible to set temperature Tc1 of the ceramic base 21A to 354° C. and set temperature Tc2 of the ceramic base 21B to 310° C. Alternatively, the temperature conditions can be changed according to the conditions within an apparatus using the ceramic heater 14. The temperature for each ceramic base can be thus separately set.

As shown in FIG. 6A, in the ceramic heater 15, the ceramic bases 21A and 21B respectively include the resistance heating elements 30 and 31 each having independent terminals similar to the ceramic heater 11. At this time, one of the ceramic bases is temperature-controlled based on measurements of the temperature thereof. The other ceramic base is controlled according to the above temperature control.

Specifically, the ceramic heater 15 can include the thermoelectric couple 61 to measure the temperature of the ceramic base 21A and a main temperature control device 140. The main temperature control device is connected to the resistance heating element 30 and the thermoelectric couple 61 as the temperature measurement unit and controls the temperature of the ceramic base 21A. The main temperature control device 140 includes a main temperature controller 112 and an output unit 122. The main temperature controller 112 controls, according to the measured temperature and the temperature setting, a current value outputted from the output unit 122. The output unit 122 supplies the controlled current value to the resistance heating element 30. As described above, the ceramic heater 15 can include the temperature measurement unit for each base and the main temperature control device for at least one of the bases. The main temperature control device is connected to the resistance heating element and temperature measurement unit and controls the temperature of the base.

The ceramic base 21B is not provided with a thermoelectric couple and is provided with a slave temperature control device 141 setting a temperature control condition according to the temperature control condition of the main temperature control device 140. In other words, the ceramic heater 15 includes the slave temperature control device 141 controlling the temperature of the ceramic base 21B, which is not subjected to temperature control by the main temperature control device 140, according to the temperature control condition of the main temperature control device 140.

The slave temperature control device 141 includes an output unit 123 connected to the resistance heating element 31 and a slave temperature controller 113 connected to the output unit 123 and the main temperature controller 112. The slave temperature controller 113 is set so that the temperature setting thereof is determined so as to have a certain relationship with the temperature setting of the main temperature controller 112. The slave temperature controller 113 controls, according to the determined temperature setting, the current value outputted from the output unit 123. The output unit 123 then supplies the controlled current value to the resistance heating element 31.

Figure 6B:
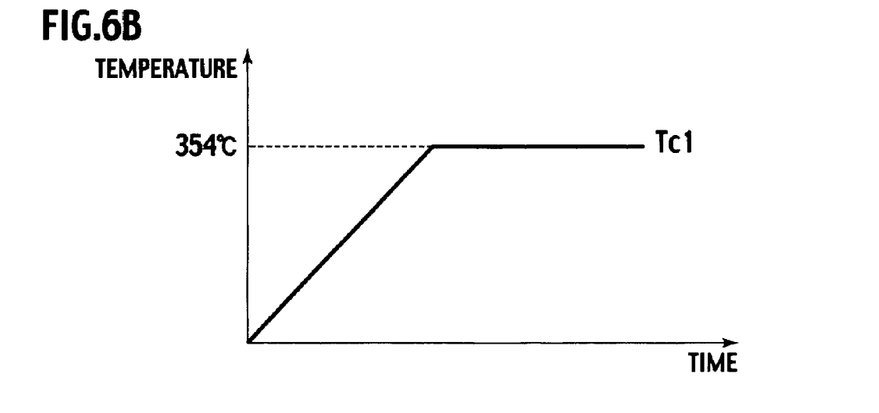
FIG. 6B is a graph showing an example of temperature control thereof.

In this case, only the temperature Tc1 of the ceramic base 21A is therefore monitored as shown in FIG. 6B. For example, the temperature setting of the ceramic base 21B can be always set to a temperature of 40° C. lower than the temperature Tc1. When the temperature settings of the ceramic bases 21A and 21B are controlled to have a certain relationship, the thermoelectric couple 61 is buried in any one of the ceramic base, and the temperature of the other base is controlled according to the ceramic base having the thermoelectric couple 61 buried. In this case, the number of thermoelectric couples can be reduced, and the apparatus constitution can be further simplified.

Figure 4:
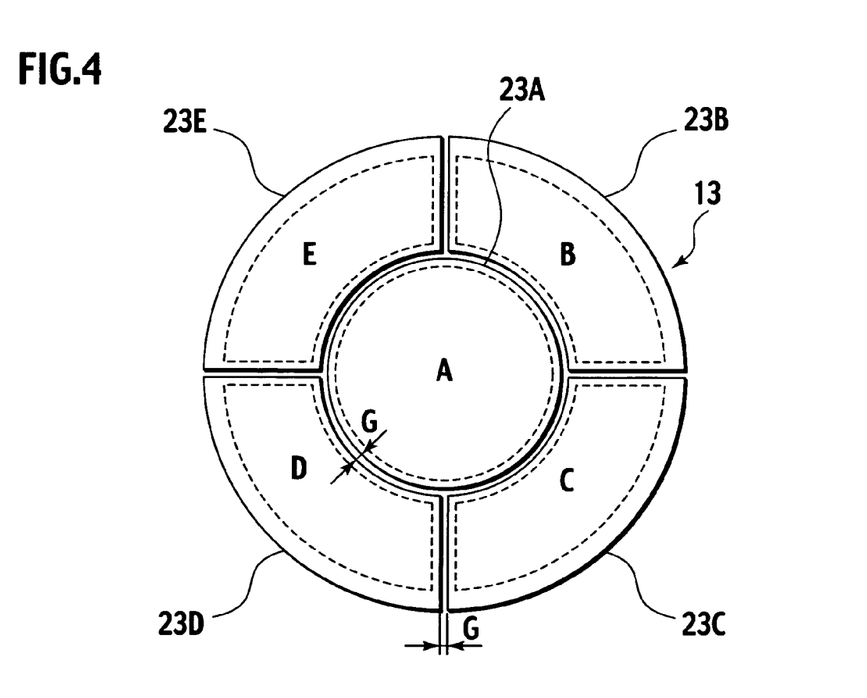
FIG. 4 is a plan view showing division pattern examples of the ceramic base group of the ceramic heaters according to another embodiment of the present invention.

The method of temperature control as shown in FIGS. 5A and 6A can be applied to the first to third embodiments and also applied to the cases with much more separate bases as shown in FIG. 4.

Figure 7:
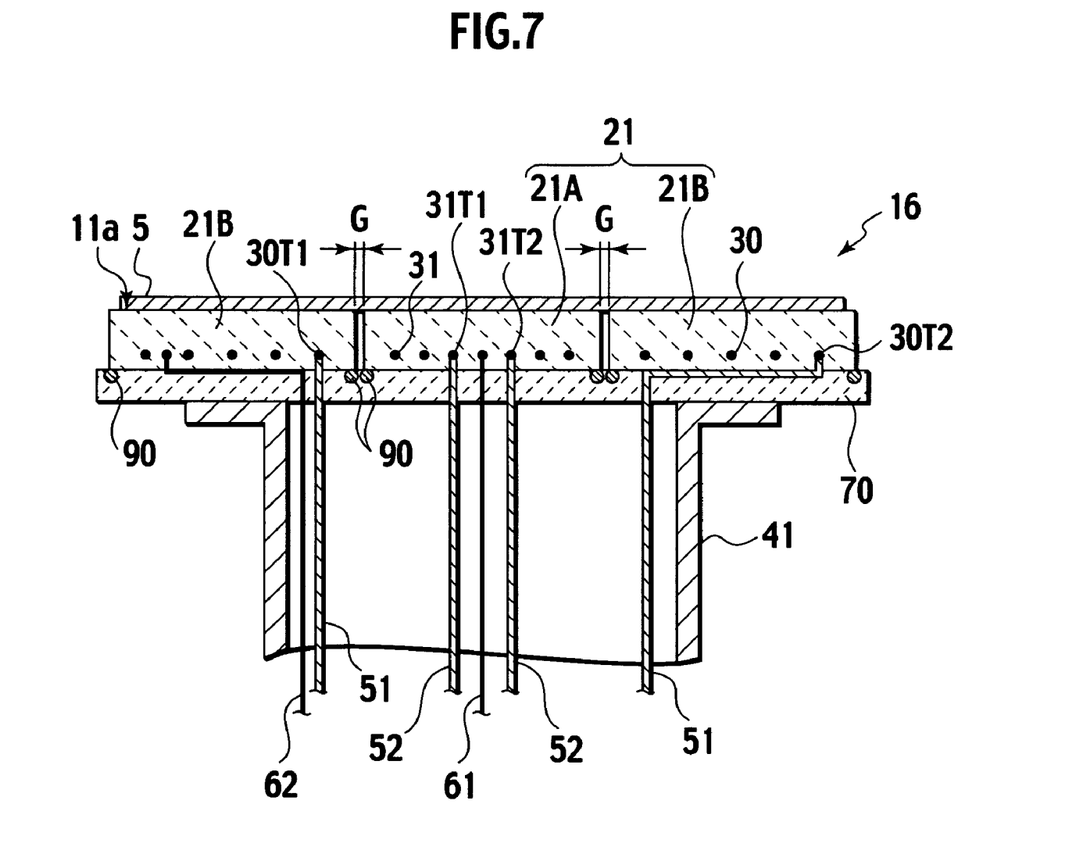
FIG. 7 is a cross-sectional view of a ceramic heater according to another embodiment of the present invention.

In addition, the method of joining the auxiliary member and the ceramic base group is not limited. For example, in the case where the temperature of a ceramic heater 16 is low, the auxiliary member 70 and the ceramic base group 21 may be joined by using sealing members 90 such as O-rings or metal seals, as shown in FIG. 7. Moreover, in the case where the temperature of the ceramic heater is equal or lower than an allowable temperature limit of the power feeders, the auxiliary member and the ceramic base group may be joined by brazing. Note that the positions for brazing may be the same as the positions, in which the sealing members 90 are provided as shown in FIG. 7, for example. Joining by sealing members 90 or brazing can prevent the power feeders and thermoelectric couples from corrosion due to corrosive gas in a chamber.

EXAMPLES

Working Example

The ceramic heater 11 shown in FIGS. 2A and 2B is formed as a working example. Specifically, a ceramic mixed powder including aluminum nitride powder obtained by reduction nitriding and 5 wt % of $Y_2O_3$ added thereto is added with an acrylic resin binder, mixed, and granulated by spray drying to prepare granulated powder. This granulated powder is filled into metal molds and pressed to form preforms. Subsequently, in the preforms, recesses are formed with transfer pattern at positions where the resistance heating elements are buried. The resistance heating elements 30 of a molybdenum wire processed into the wound body shown in FIG. 2B and the resistance heating element 31 of a molybdenum wire processed into the folded body then individually placed in the recesses. Furthermore, the ceramic raw powder is filled thereon and pressed at about 200 kg/cm$^2$ to produce compacts as the ceramic bases 21A and 21B. These compacts are sintered in a hot press furnace under a nitrogen atmosphere with a gauge pressure of 0.5 kg/cm$^2$, at 1860° C. for 6 hours.

As the disk-shaped ceramic base 21A, an aluminum nitride sintered body having a diameter of 100 mm and a thickness of 20 mm is formed. As the ring-shaped ceramic base 21B, an aluminum nitride sintered body having an inner diameter of 104 mm, an outer diameter of 310 mm, and a thickness of 20 mm is formed.

Separately, the same granulated powder as the ceramic bases is used for forming compacts and atmospheric sintered to form the plate-shaped auxiliary member 70 and the tubular member 41. The auxiliary member 70 is pressed in an axial direction to be formed, and the tubular member 41 was formed by CIP.

In the ceramic bases 21A and 21B, auxiliary member 70, and tubular member 41, threaded holes, which are necessary for a connection between the terminals and the power feeders 51 and 52 and thermoelectric couples, are formed. As shown in FIG. 2A, the ceramic bases 21A and 21B are screwed to the auxiliary member 70 using ceramic screws, and the auxiliary member 70 is screwed to the tubular member 41 using ceramic screws. The terminals 30T1, 30T2, 31T1, and 31T2 of the resistance heating elements 30 and 31 and the terminals of the thermoelectric couples are fixed where needed by brazing.

Comparative Example

A ceramic heater of a comparative example is formed using same manufacturing conditions as those of the aforementioned working example. The ceramic heater of the comparative example includes a single-piece ceramic base. The ceramic base has two zones of the central part and the peripheral part, in each of which a resistance heating element having independent terminals is buried. Shapes of the resistance heating elements are the same as the shapes of those buried in the ceramic bases 21A and 21B of the working example, respectively.

(Evaluation)

Figure 8:
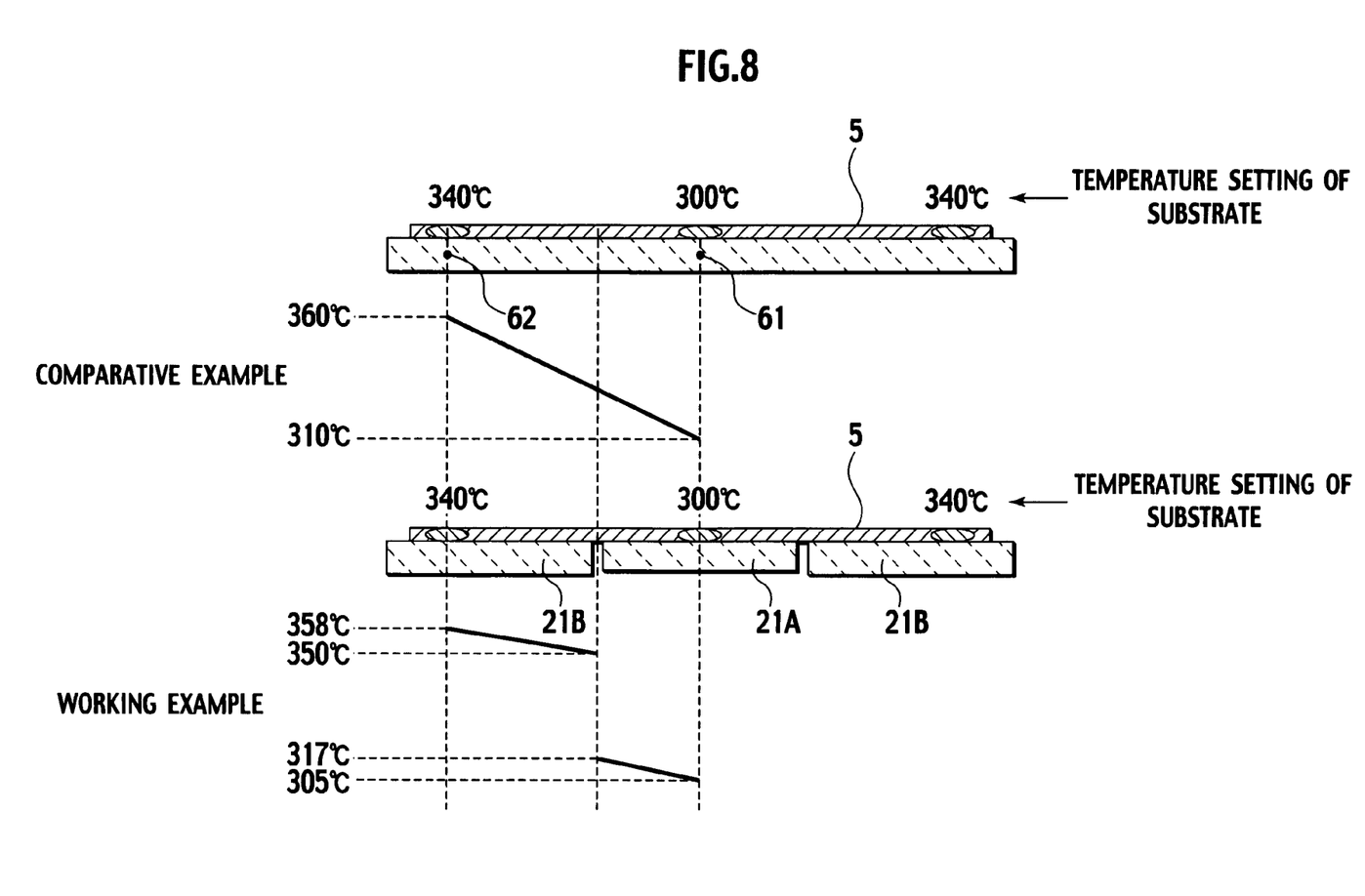
FIG. 8 is a view showing results of measurement of in-plane temperature distributions of ceramic heaters of a working example of the present invention and a comparative example.

A substrate is placed on each of the ceramic heaters of the working example and the comparative example. The heat values generated by the resistance heating elements are adjusted so that the temperature setting in the central part of the substrate is 300° C. and the temperature setting in the peripheral part of the substrate is 340° C. The temperature within the ceramic base at this time is measured using the thermoelectric couple, results of which are shown in FIG. 8. In FIG. 8, the auxiliary member 70, tubular member 41, and resistance heating elements 30 and 31 are omitted.

In the case of the ceramic heater of the comparative example including the conventional single-piece ceramic base, the temperature within the ceramic heater is 310° C. just under the central part of the substrate in which the substrate temperature is set to 300° C. On the other hand, the temperature within the ceramic heater is 360° C. just under the peripheral part of the substrate in which the substrate temperature is set to 340° C. Within the ceramic heater, there is a temperature difference equal to or more than about 50° C. between the central part and the peripheral part in the in-plane direction.

On the contrary, in the ceramic heater 11 of the working example which includes two separate parts with the gap provided therebetween, the temperature in substantially the center of the ceramic base 21A in the thickness direction was 305° C. just under the central part of the substrate in which the substrate temperature is set to 300° C. On the other hand, the temperature in the peripheral part of the ceramic base 21A is 317° C. The temperature difference in the in-plane direction within the ceramic base 21A is only 12° C. The temperature in the ceramic base 21B is 358° C. just under the outer peripheral part of the substrate in which the substrate temperature is set to 340° C., and the temperature in the inner peripheral part of the ceramic base 21B is 350° C. It was thus confirmed that the temperature difference within the ceramic base 21b in the in-plane direction is equal to or less than 10° C.

As shown in FIG. 8, in the ceramic heater 11 of the working example including the ceramic base group with the plurality of ceramic bases, it is possible to significantly reduce the in-plane difference in temperature in each of the ceramic bases 21A and 21B compared to the ceramic heater including the conventional single-piece ceramic base. As shown in FIG. 8, it is confirmed that even in the case of setting different temperatures by locations, generation of thermal stress due to the in-plane difference in temperature is reduced and the damage due to the thermal stress can be prevented.

Although the inventions have been described above by reference to certain embodiments of the inventions, the inventions are not limited to the embodiments described above. Modifications and variations of the embodiments described above will occur to those skilled in the art, in light of the above teachings.

What is claimed is:

1. A substrate heating apparatus, comprising:
   a base group including a plurality of bases, which are arranged into substantially a plate with a gap interposed between the bases and form a substrate mounting surface;
   a resistance heating element provided for at least one of the bases;
   a plate-shaped auxiliary member, comprising an insulator, arranged in contact with a surface of the base group opposing the substrate mounting surface; and
   a power feeder, which is connected to a terminal of the resistance heating element and is wired between the base group and the auxiliary member.

2. The substrate heating apparatus according to claim 1, wherein the bases include a ceramic.

3. The substrate heating apparatus according to claim 2, wherein the bases include aluminum nitride.

4. The substrate heating apparatus according to claim 1, wherein the resistance heating element is buried in at least one of the bases.

5. The substrate heating apparatus according to claim 1, wherein each of the bases includes the resistance heating element having terminals.

6. The substrate heating apparatus according to claim 5, further comprising:
   a temperature measurement unit for each of the bases; and
   a temperature control device for each of the bases, which is connected to the resistance heating element and the temperature measurement unit and controls temperature of the base.

7. The substrate heating apparatus according to claim 5, further comprising:
   a temperature measurement unit for each of the bases;
   at least a main temperature control device for each base, which is connected to the resistance heating element and the temperature measurement unit and controls temperature of the base; and
   a slave temperature control device controlling temperature of the base, which is not subjected to temperature control by the main temperature control device, according to a temperature control condition of the main temperature control unit.

8. The substrate heating apparatus according to claim 1, wherein the width of the gap is about 0.1 mm to about 10 mm.

9. The substrate heating apparatus according to claim 1, wherein the base group includes a first base and an annular second base arranged around a periphery of the first base.

10. The substrate heating apparatus according to claim 1, wherein the auxiliary member includes a ceramic.

11. The substrate heating apparatus according to claim 1, further comprising a tubular member directly or indirectly connected to a central part of a surface of the base group opposite to the substrate mounting surface.

12. The substrate heating apparatus according to claim 11, wherein
   the tubular member is connected to the central part of the surface of the base group opposing the substrate mounting surface with the auxiliary member interposed between the base group and the tubular member.

13. The substrate heating apparatus according to claim 11, wherein the tubular member includes at least one of a metal and a ceramic.

14. The substrate heating apparatus according to claim 12, wherein the auxiliary member and the tubular member are a ceramic integrated sintered body.

15. The substrate heating apparatus according to claim 1, further comprising an electrode buried in the base for applying at least one of electrostatic force and applying radio frequency.

16. The substrate heating apparatus according to claim 1, wherein the resistance heating element includes at least one of molybdenum and tungsten.

17. The substrate heating apparatus according to claim 1, wherein the power feeder, which is connected to a terminal of the resistance heating element, includes at least one of nickel and aluminum.

18. A substrate heating apparatus, comprising:
   a base group including a plurality of bases, which are arranged into substantially a plate with a gap interposed between the bases and form a substrate mounting surface;

a resistance heating element provided for at least one of the bases;

a tubular member directly or indirectly connected to a central part of a surface of the base group opposing the substrate mounting surface; and a plate-shaped auxiliary member arranged in contact with the surface of the base group opposing the substrate mounting surface, wherein the auxiliary member is interposed between the base group and the tubular member.

19. A substrate heating apparatus, comprising:

a base group including a plurality of bases, which are arranged into substantially a plate with a gap interposed between the bases and form a substrate mounting surface;

a resistance heating element provided for at least one of the bases;

a tubular member directly or indirectly connected to a central part of a surface of the base group opposing the substrate mounting surface; and a plate-shaped auxiliary member arranged in contact with the surface of the base group opposing the substrate mounting surface, wherein the auxiliary member is interposed between the base group and the tubular member, and wherein the auxiliary member and the tubular member comprise an integrated ceramic sintered body.

* * * * *